US006569601B1

(12) United States Patent
Bennett et al.

(10) Patent No.: US 6,569,601 B1
(45) Date of Patent: May 27, 2003

(54) RADIATION TREATABLE PRINTING PLATE

(75) Inventors: David S. Bennett, Davenport, IA (US); Sallie L. Blake, Long Grove, IA (US); Robert E. Bombalski, New Kensington, PA (US); Daniel L. Serafin, Wexford, PA (US); Jean Ann Skiles, Gibsonia, PA (US)

(73) Assignee: Alcoa Inc., Pittsburgh, PA (US)

(*) Notice: Subject to any disclaimer, the term of this patent is extended or adjusted under 35 U.S.C. 154(b) by 68 days.

(21) Appl. No.: 09/680,363

(22) Filed: Oct. 5, 2000

Related U.S. Application Data

(63) Continuation-in-part of application No. 09/662,400, filed on Sep. 13, 2000.

(51) Int. Cl.[7] .................................................. G03F 7/11

(52) U.S. Cl. ............................... 430/273.1; 430/270.1; 430/271.1; 430/275.1

(58) Field of Search .......................... 430/270.1, 271.1, 430/273.1, 275.1

(56) References Cited

U.S. PATENT DOCUMENTS

| | | | | |
|---|---|---|---|---|
| 3,276,868 A | | 10/1966 | Uhlig | 96/1.5 |
| 5,339,737 A | | 8/1994 | Lewis et al. | 101/454 |
| 5,353,705 A | | 10/1994 | Lewis et al. | 101/453 |
| 5,407,702 A | | 4/1995 | Smith et al. | 427/211 |
| 5,570,636 A | | 11/1996 | Lewis | 101/454 |
| RE35,512 E | | 5/1997 | Nowak et al. | 101/454 |
| 5,711,911 A | | 1/1998 | Hull | 264/401 |
| 5,786,129 A | | 7/1998 | Ellis | 430/302 |
| 5,795,647 A | | 8/1998 | Robinson et al. | 428/329 |
| 5,807,658 A | | 9/1998 | Ellis et al. | 430/302 |
| 5,829,353 A | | 11/1998 | Ellis | 101/460 |
| 5,919,517 A | | 7/1999 | Levendusky et al. | 427/211 |
| 5,931,097 A | | 8/1999 | Neifert et al. | 104/454 |
| 5,988,066 A | | 11/1999 | Robinson et al. | 101/457 |
| 5,996,496 A | | 12/1999 | Lewis et al. | 101/462 |
| 5,996,498 A | | 12/1999 | Lewis | 101/467 |
| 6,006,667 A | | 12/1999 | Lewis | 101/462 |
| 6,020,030 A | | 2/2000 | Guthrie et al. | 427/345 |
| 6,030,710 A | | 2/2000 | Nitowski et al. | 428/457 |
| 6,055,906 A | | 5/2000 | Lewis | 101/467 |
| 6,063,528 A | * | 5/2000 | Morgan | 430/270.1 |
| 6,073,559 A | | 6/2000 | Ellis | 101/454 |
| 6,087,069 A | | 7/2000 | Ellis | 430/273.1 |
| 6,095,048 A | | 8/2000 | Ellis | 101/452 |
| 6,095,049 A | | 8/2000 | Lewis et al. | 101/467 |
| 6,110,644 A | | 8/2000 | Vermeersch et al. | 430/302 |
| 6,190,830 B1 | * | 2/2001 | Leon et al. | 430/270.1 |

FOREIGN PATENT DOCUMENTS

| | | | | |
|---|---|---|---|---|
| EP | o 619 524 A1 | * | 10/1994 | |
| EP | 0626273 | | 11/1994 | B41N/3/03 |
| EP | 0 924 065 A1 | * | 6/1999 | |
| EP | 0 924 102 A1 | * | 6/1999 | |
| EP | 0 990 516 A1 | * | 4/2000 | |
| EP | 1 029 666 A1 | | 8/2000 | B41C/1/10 |
| GB | 1 448 838 | | 9/1976 | B41C/1/10 |
| GB | 2 343 680 A | * | 5/2000 | |
| WO | 99/51690 | | 10/1999 | C09B/69/00 |

* cited by examiner

*Primary Examiner*—Cynthia Hamilton
(74) *Attorney, Agent, or Firm*—Julie W. Meder; Glenn E. Klepac

(57) ABSTRACT

A printing plate for computer-to plate lithography having a laser-ablatable member supported by a substrate. At least one portion of the laser-ablatable member is formed form an acrylic polymer containing laser-sensitive particles. The laser-sensitive particles absorb imaging radiation and cause the portion of the laser-ablatable member containing the laser sensitive particles and any overlying layers to be ablated.

6 Claims, 7 Drawing Sheets

RADIATION TREATABLE PRINTING PLATE

RELATED APPLICATION

This application is a continuation-in-part of Ser. No. 09/662,400 filed Sep. 13, 2000, entitled "Printing Plate".

FIELD OF THE INVENTION

The present invention relates to printing plate materials suitable for imaging by digitally controlled laser radiation. More particularly, the invention relates to printing plate materials having one or more layers of an organic composition thereon.

BACKGROUND OF THE INVENTION

Printing plates suitable for imaging by digitally controlled laser radiation include a plurality of imaging layers and intermediate layers coated thereon. Laser radiation suitable for imaging printing plates preferably has a wavelength in the visible or near-infrared region, between about 400 and 1500 nm. Solid state laser sources (commonly termed "semiconductor lasers") are economical and convenient sources that may be used with a variety of imaging devices. Other laser sources such as $CO_2$ lasers and lasers emitting light in the visible wavelengths are also useful.

Laser output can be provided directly to the plate surface via lenses or other beam-guiding components, or transmitted to the surface of a blank printing plate from a remotely sited laser through a fiber-optic cable. A controller and associated positioning hardware maintains the beam output at a precise orientation with respect to the plate surface, scans the output over the surface, and activates the laser at positions adjacent selected points or areas of the plate. The controller responds to incoming image signals corresponding to the original figure or document being copied onto the plate to produce a precise negative or positive image of that original. The image signals are stored as a bitmap data file on the computer. Such files may be generated by a raster image processor (RIP) or other suitable means. For example, a RIP can accept data in page-description language, which defines all of the features required to be transferred onto a printing plate, or as a combination of page-description language and one or more image data files. The bitmaps are constructed to define the hue of the color as well as screen frequencies and angles.

The imaging apparatus can operate on its own, functioning solely as a platemaker, or can be incorporated directly into a lithographic printing press. In the latter case, printing may commence immediately after application of the image to a blank plate, thereby reducing press set-up time considerably. The imaging apparatus can be configured as a flatbed recorder or as a drum recorder, with the lithographic plate blank mounted to the interior or exterior cylindrical surface of the drum. Obviously, the exterior drum design is more appropriate to use in situ, on a lithographic press, in which case the print cylinder itself constitutes the drum component of the recorder or plotter.

In the drum configuration, the requisite relative motion between the laser beam and the plate is achieved by rotating the drum (and the plate mounted thereon) about its axis and moving the beam perpendicular to the rotation axis, thereby scanning the plate circumferentially so the image "grows" in the axial direction. Alternatively, the beam can move parallel to the drum axis and, after each pass across the plate, increment angularly so that the image on the plate "grows" circumferentially. In both cases, after a complete scan by the beam, an image corresponding (positively or negatively) to the original document or picture will have been applied to the surface of the plate.

In the flatbed configuration, the beam is drawn across either axis of the plate, and is indexed along the other axis after each pass. Of course, the requisite relative motion between the beam and the plate may be produced by movement of the plate rather than (or in addition to) movement of the beam.

Regardless of the manner in which the beam is scanned, it is generally preferable (for reasons of speed) to employ a plurality of lasers and guide their outputs to a single writing array. The writing array is then indexed, after completion of each pass across or along the plate, a distance determined by the number of beams emanating from the array, and by the desired resolutions (i.e., the number of image points per unit length.)

Some prior art patents disclosing printing plates suitable for imaging by laser ablation are Lewis et al. U.S. Pat. Nos. 5,339,737, 5,996,496 and 5,996,498.

Although these prior art printing plates perform adequately, certain of them are expensive to produce because the absorbing layer is vapor deposited onto an oleophilic polyester layer. Adhesive bonding of the polyester layer to a metal substrate also adds to the cost.

SUMMARY OF THE INVENTION

The present invention includes a printing plate material having a substrate coated with one or more layers of a polymer composition. The substrate may be a metal, preferably an aluminum alloy or steel, paper or plastic.

In one embodiment, a laser-ablatable member including a polymeric composition is positioned on one side of the substrate. When the substrate is metal, the principal surface may be finished by at least one of roll texturing, mechanical texturing, chemical texturing or electrochemical texturing. The laser-ablatable member preferably is formed from a polymer composition including a hydrophilic acrylic polymer and a plurality of laser-sensitive particles, wherein the polymer composition is ablatable when a laser irradiates the laser-sensitive particles. A preferred acrylic polymer is a copolymer containing an organophosphorous compound, particularly, a copolymer of acrylic acid and vinyl phosphonic acid. The laser-sensitive particles preferably are dyes, metals, minerals or carbon. The laser-ablatable member may be formed from an oleophilic thermoplastic or elastomeric polymer wherein an upper portion of the laser-ablatable member is treated to be hydrophilic.

A portion of the laser-ablatable member includes a layer not having the laser-sensitive particles. The layer not having laser-sensitive particles has a different affinity for a printing liquid from a remainder of the laser-ablatable member having the laser-sensitive particles. This layer may underlie the remainder of the laser-ablatable member, overlie the remainder of the laser-ablatable member or be positioned intermediate of the remainder of the laser-ablatable member.

Alternatively, a portion of the laser-ablatable member may include a second polymer having a different affinity for printing liquid from the polymer composition. Suitable second polymer compositions include an acrylic polymer without the laser-sensitive particles, a silicone polymer or a thermoplastic or elastomeric polymer.

In another embodiment of the invention, the printing plate includes a substrate, a first layer comprising a first polymer composition overlying the substrate and a second layer comprising a second polymer composition overlying the first layer, wherein and the first layer and second layer have different affinities for a printing liquid. The first polymer composition includes an acrylic polymer and includes a plurality of laser-sensitive particles. The second polymer composition may include a hydrophilic polypropylene composition, an acrylic polymer or a silicone polymer or copolymer. Preferably, the acrylic polymer is a copolymer of acrylic acid and vinyl phosphonic acid. The printing plate may further include a third layer underlying the first layer. The third layer is formed from a hydrophilic polypropylene composition, an acrylic polymer or a thermoplastic or elastomeric polymer. The third layer may be applied to the substrate via roll coating, spray coating, immersion coating, emulsion coating, powder coating or vacuum coating. Alternatively, the third layer may be a conversion coating of a salt of or a compound of Zn, Cr, P, Zr, Ti or Mo or it may be formed of an epoxy resin electrocoated onto the substrate.

In yet another embodiment of the invention, imaging radiation does not cause ablation of any polymer layers. This embodiment includes a printing member positioned on the principal surface of the substrate and having an upper surface formed from a polymeric composition which is non-ablatable by imaging radiation. The upper surface has an initial affinity for a printing liquid and is changeable to a different affinity for a printing liquid when the printing member is subjected to imaging radiation. The polymeric composition preferably includes an acrylic polymer, more preferably includes an organophosphorous compound. The printing member may include a first layer underlying the upper surface. The first layer is formed from a polymer, preferably an acrylic polymer, and a plurality of radiation-absorbing particles such a dye, a metal, a mineral or carbon. A second layer may underlie the first layer and may be an acrylic polymer or a conversion coating of a salt or compound of Zn, Cr, P, Zr, Ti or Mo.

DETAILED DESCRIPTION OF THE PREFERRED EMBODIMENTS

Figure 1A:
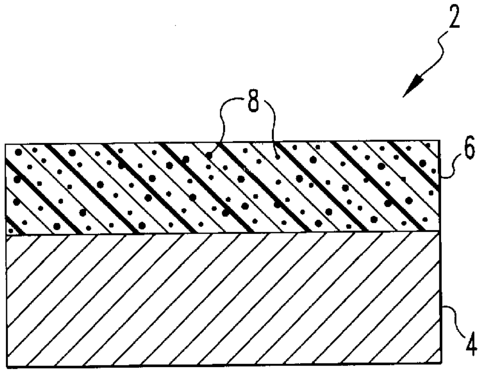
FIGS. 1*a*, 1*b*, 1*c* and 1*d* are cross-sectional views of a first embodiment of a printing plate made in accordance with the present invention.

For purposes of the description hereinafter, the terms “upper”, “lower”, “right”, “left”, “vertical”, “horizontal”, “top”, “bottom” and derivatives thereof relate to the invention as it is oriented in the drawing figures. However, it is to be understood that the invention may assume various alternative variations and step sequences, except where expressly specified to the contrary. It is also to be understood that the specific devices and processes illustrated in the attached drawings, and described in the following specification, are simply exemplary embodiments of the invention. Hence, specific dimensions and other physical characteristics related to the embodiments disclosed herein are not to be considered as limiting.

In its most basic form, the present invention includes a printing plate for imaging having a substrate and one or more hydrophilic acrylic polymer layers positioned thereon which are laser-ablatable. By the term laser-ablatable, it is meant that the material or layer is subject to absorption of infrared laser light causing ablation thereof and any material overlying the ablated material. The substrate may or may not be involved in printing depending on whether or not the overlying polymer layers are completely ablated.

For each of the embodiments described hereinafter, the substrate may be a metal, preferably an aluminum alloy or steel, paper or plastic. Suitable aluminum alloys include alloys of the AA 1000, 3000, and 5000 series. Suitable steel substrates include mild steel sheet and stainless steel sheet.

An aluminum alloy substrate preferably has a thickness of about 1–30 mils, preferably about 5–20 mils, and more preferably about 8–20 mils. An unanodized aluminum alloy substrate having a thickness of about 8.8 mils is particularly preferred.

The substrate may be mill finished or may be further finished via roll texturing, chemical texturing or electrochemical texturing or combinations thereof. Roll texturing may be accomplished via electron discharge texturing (EDT), laser texturing, electron beam texturing, mechanical texturing, chemical texturing or electrochemical texturing or combinations thereof. Preferred mechanical texturing includes shot peening and brush graining. The resulting textured surface provides a more diffuse surface than a mill finished surface with concomitant higher uniformity in the surface. During laser-ablation, non-uniform surface defects have been associated with laser back reflections. The textured surface of the product of the present invention minimizes laser back reflections and improves the uniformity and efficiency of the laser ablation process.

A principal surface of the metal surface is cleaned to remove surface contaminants such as lubricant residues. Some suitable chemical surface cleaners include alkaline and acid aqueous solutions. Plasma radiation, corona discharge and laser radiation may also be utilized.

Figure 1B:
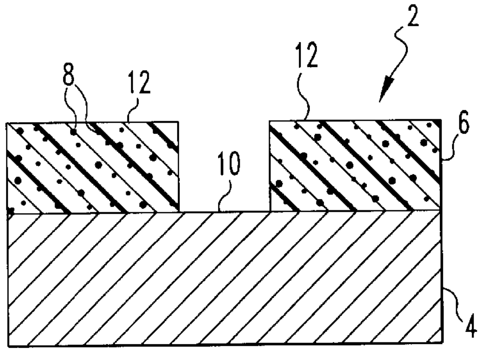

In a first embodiment of the printing plate 2 of the present invention shown in FIGS. 1*a* and 1*b*, the substrate 4 is coated with a laser-ablatable member 6. The laser-ablatable member 6 is formed from an acrylic polymer and includes a plurality of laser-sensitive particles 8 dispersed in the acrylic polymer.

For this first embodiment and as referenced hereinafter, the acrylic polymer is hydrophilic. A preferred acrylic polymer is a copolymer with an organophosphorus compound. As used herein, the term “organophosphorus compound” includes organophosphoric acids, organophosphonic acids, organophosphinic acids, as well as various salts, esters, partial salts, and partial esters thereof. The organophosphorus compound may be copolymerized with acrylic acid or methacrylic acid. Copolymers of vinyl phosphonic acid are preferred, especially copolymers containing about 5–50 mole % vinyl phosphonic acid and about 50–95 mole % acrylic acid and having a molecular weight of about 20,000–100,000. Copolymers containing about 70 mole % acrylic acid groups and about 30 mole % vinylphosphonic acid groups are particularly preferred. The acrylic polymer may be applied in batch processing of sheet or in coil processing by conventional coating processes including roll coating, powder coating, spray coating, vacuum coating, emulsion coating or immersion coating. Preferably, the acrylic polymer is applied by roll coating, typically to a thickness of about 0.01–1.0 mil, preferably about 0.1–0.3 mil. Acrylic polymers including copolymers of vinyl phosphonic acid and acrylic acid are hydrophilic.

The laser-sensitive particles 8 are formed from any type of material which absorbs infrared radiation. Preferred particles are dyes or inorganic particles having an average particle size of about 7 microns or less. A preferred dye is an azine compound or an azide compound or any other dye that absorbs light in the range of about 500 to about 1100 nanometers. A particularly preferred dye is Nigrosine Base BA available from Bayer Corporation of Pittsburgh, Pa. When the laser-ablatable member 6 includes an acrylic acid—vinyl phosphonic acid copolymer and an azine dye, a preferred concentration of the dye is about 1–10 wt. %, preferably about 3–5 wt. %. The inorganic particles may be particles of a metal, a mineral or carbon. The metal particles may be magnesium, copper, cobalt, nickel, lead, cadmium, titanium, iron, bismuth, tungsten, tantalum, silicon, chromium, aluminum or zinc, preferably iron, aluminum, nickel, or zinc. When the laser-ablatable member 6 includes an acrylic acid—vinyl phosphonic acid copolymer and manganese oxide, a preferred concentration of manganese oxide particles having an average particle size of about 0.6 micron is about 1–15 wt. %. The mineral particles may be oxides, borides, carbides, sulfides, halides or nitrides of the metals identified above, or clay. Clay includes aluminum silicates and hydrated silicates such as feldspar and kaolinate. Carbon may be used in the form of carbon black, graphite, lampblack or other commercially available carbonaceous particles. Combinations of particles having different compositions are within the scope of our invention. Although acrylic polymers are inherently hydrophilic, inclusion of a sufficient amount of the laser-sensitive particles makes the composition of an acrylic polymer with laser-sensitive particles oleophilic. The present invention uses polymer compositions having an acrylic polymer and a sufficient amount of the laser-sensitive particles makes the polymer composition oleophilic.

In use, the printing plate 2 is imaged with a laser which ablates the laser-ablatable member 6 in the regions of the printing plate in which ink is to be received to expose the substrate as shown in FIG. 1*b*. Ablation of the member 6 exposes regions 10 of the substrate leaving unablated regions 12. The regions 10 and 12 have different affinities for a printing liquid. Aluminum is a preferred substrate because aluminum acts hydrophilic or oleophilic depending on the water affinity and ink affinity properties of the laser-ablatable member 6 thereon. In this case, where the laser-ablatable member is oleophilic, the aluminum substrate will act hydrophilic. Ink of a printing liquid containing water or a fountain solution will adhere to the regions 12 (unablated member 6) while the regions 10 (aluminum substrate 4) will be covered with water or a fountain solution.

Figure 1C:
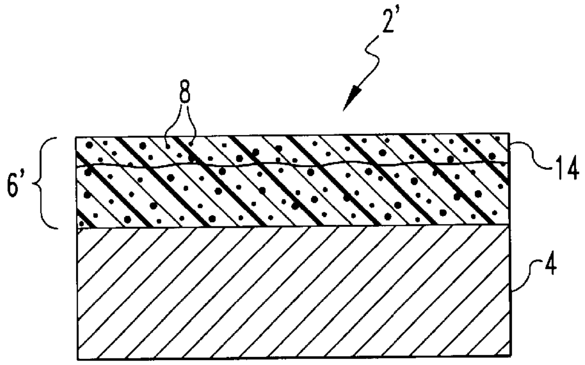
Figure 1D:
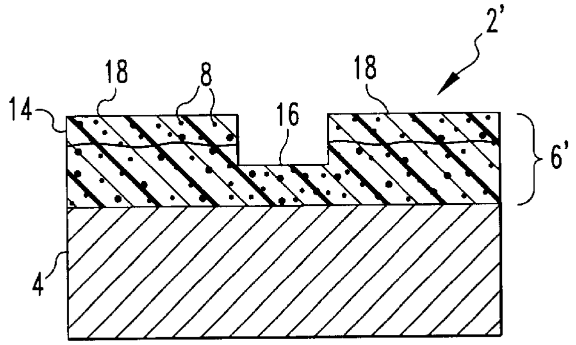

Alternatively, as shown in FIGS. 1*c* and 1*d*, a plate 2' includes a substrate 4 and a laser-ablatable member 6' formed from a polymer composition containing an acrylic polymer and a plurality of laser-sensitive particles 8. An upper portion 14 of the laser-ablatable member 6' is treated to make the upper portion 14 oleophilic. Preferred treatments include corona discharge, electron beam discharge, laser radiation or heating. As shown in FIG. 1*d*, the plate 2' is preferably imaged with a laser to completely remove the upper portion 14 and to expose hydrophilic regions 16 and leave unablated oleophilic regions 18. The laser-ablatable member 6' may alternatively be formed from an oleophilic polymer and a plurality of laser-sensitive particles 8. Suitable oleolphilic polymers include thermoplastic or elastomeric polymers. Preferred thermoplastic polymers include polyvinyl chloride, polyolefins, polycarbonates, polyamides and polyesters such as polyethylene terephthalate (PET). Suitable elastomeric polymers include polybutadiene, polyether urethanes and poly(butadiene-co-acrylonitrile). The thermoplastic or elastomeric polymers may be applied to the substrate 4 via the methods disclosed in U.S. Pat. Nos. 5,711,911, 5,795,647 and 5,988,066, each being incorporated herein by reference. Treatment of the upper portion 14 of the oleophilic polymer by the above-described methods makes the upper portion 14 hydrophilic. When an oleophilic polymer is used in the laser-ablatable member 6', the exposed regions 16 are oleophilic and the unablated regions 18 are hydrophilic.

Figure 2A:
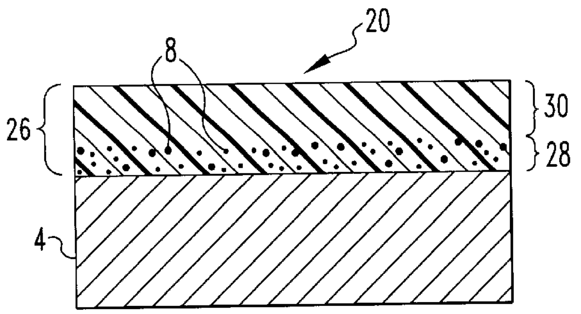
FIGS. 2*a* and 2*b* are cross-sectional views of a second embodiment of the printing plate of the present invention.
Figure 2B:
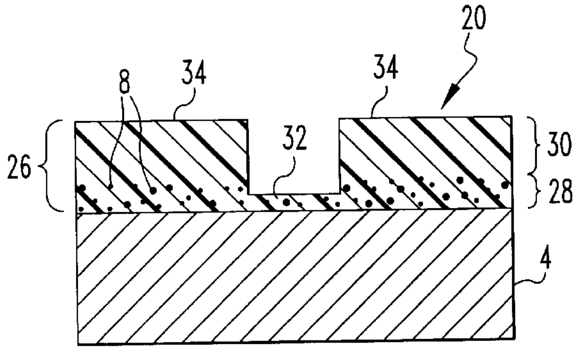

In a second embodiment of the invention, the laser-ablatable member includes laser-sensitive particles in only a portion thereof. As shown in FIGS. 2*a* and 2*b*, a plate 20 includes a substrate 4 covered by a laser-ablatable member 26 of an acrylic polymer with laser-sensitive particles 8 dispersed in a layer 28. The layer 28 is positioned near or adjacent the bottom of the laser-ablatable member 26 and is covered by an upper portion 30 of the member 26 not having any laser-sensitive particles therein. As shown in FIG. 2*b*, the plate 20 is preferably imaged with a laser to completely remove the portion 30 and partially ablate the layer 28 to expose regions 32 and leave unablated regions 34. The ablated regions 32 are oleophilic and the unablated regions 34 are hydrophilic. Ink of a printing liquid containing water or a fountain solution will adhere to the regions 32 while the regions 34 will be covered with water or a fountain solution.

Figure 3A:
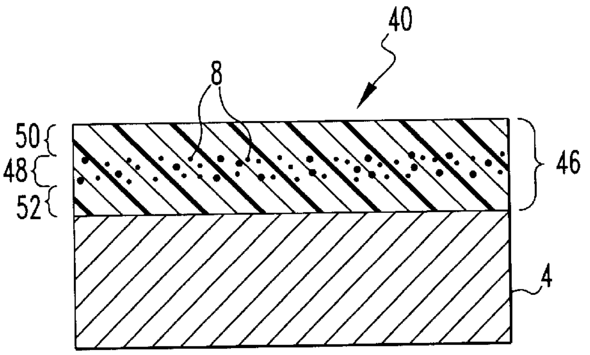
FIGS. 3*a* and 3*b* are cross-sectional views of a variation of the printing plate shown in FIGS. 2*a* and 2*b;*
Figure 3B:
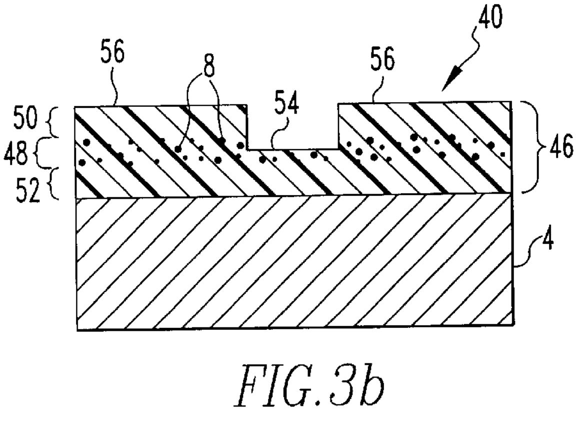

Alternatively, as shown in FIGS. 3*a* and 3*b*, a plate 40 includes a substrate 4 and a laser-ablatable member 46 having a layer 48 of an acrylic polymer containing the laser-sensitive particles at a location between a upper portion 50 and a lower portion 52. The upper portion 50 and the lower portion 52 do not have any laser-sensitive particles 8 therein. As shown in FIG. 3*b*, the plate 40 is preferably imaged with a laser to completely remove the upper portion 50 and partially ablate the layer 48 and without ablating the lower portion 52 to expose oleophilic regions 54 and leave unablated hydrophilic regions 56.

Figure 4A:
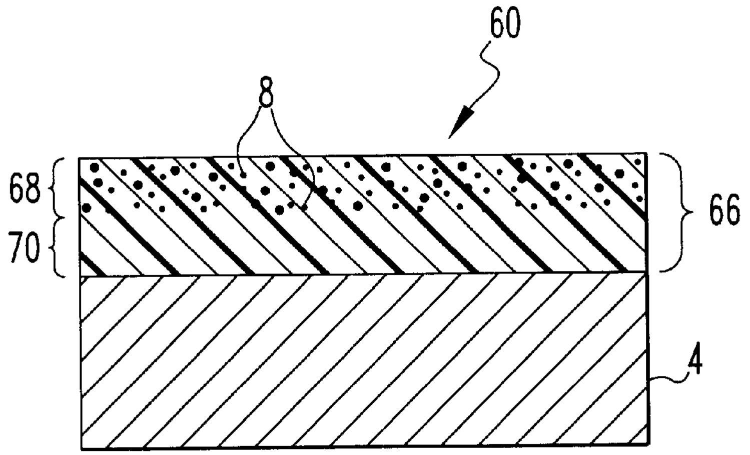
FIGS. 4*a* and 4*b* are cross-sectional views of a variation of the printing plate shown in FIGS. 2*a* and 2*b;*
Figure 4B:
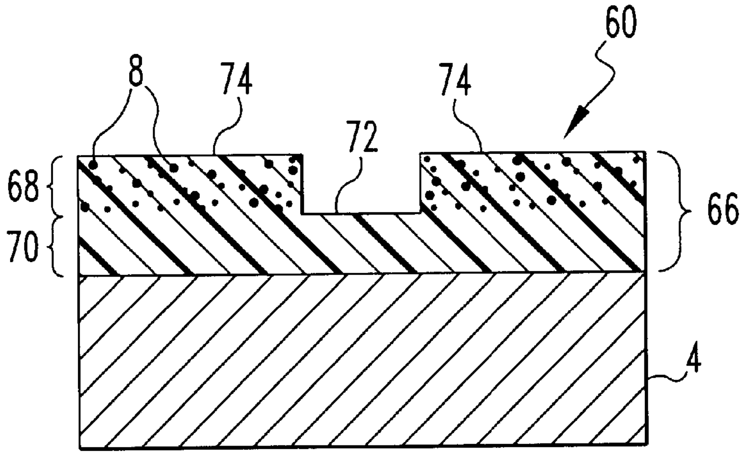

Furthermore, as shown in FIGS. 4*a* and 4*b*, the invention includes a plate 60 having a substrate 4 and a laser-ablatable member 66 with a layer 68 of an acrylic polymer containing the laser-sensitive particles 8 at a location adjacent or near the top of the laser-ablatable member 66. A lower portion 70 of the member 66 not having any laser-sensitive particles therein underlies the layer 68. As shown in FIG. 4*b*, the plate 60 is preferably imaged with a laser to completely ablate the layer 68 to expose regions 72 of the lower portion 70 and leave unablated regions 74. The regions 74 are oleophilic and the regions 72 are hydrophilic.

In each of respective plates 20, 40 and 60, the location of the layers 28, 48 and 68 determines the depth of laser ablation of the respective laser-ablatable members 26, 46 and 66. In the plates 20, 40 and 60, the respective layers 28, 48 and 68 are oleophilic while the respective upper portions 30 and 50 and lower portion 70 are hydrophilic. Imaging via laser-ablation preferably results in the arrangements shown in FIGS. 2b, 3b and 4b such that ink in a printing liquid may adhere to the respective exposed layers 28, 48 and 68 while water or a fountain solution may adhere to the respective unablated areas of the portions 30, 50 and 70.

The plate 20 may be formed by first applying an acrylic polymer containing the laser-sensitive particles 8 onto the substrate 4 to produce the layer 28 followed by applying an acrylic polymer without any laser-sensitive particles onto the layer 28 to form the upper portion 30. The plate 60 is produced in a similar manner except that the layer 70 without the laser-sensitive particles is applied before the layer 68 containing the laser-sensitive particles. The plate 40 likewise may be formed by first applying an acrylic polymer without any laser-sensitive particles onto the substrate 4 to produce the lower portion 52, followed by applying an acrylic polymer containing the laser-sensitive particles 8 onto the lower portion 52 to produce the layer 48 and applying an acrylic polymer without any laser-sensitive particles onto the layer 48 to form the upper portion 50. Suitable methods of applying the acrylic polymer with or without the laser-sensitive particles therein include roll coating, spray coating, immersion coating, emulsion coating, powder coating and vacuum coating.

Figure 5A:
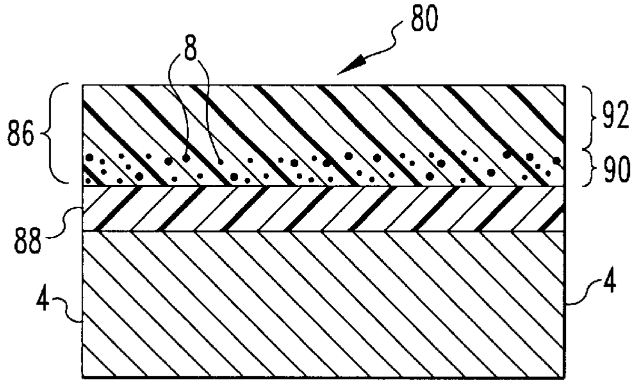
FIGS. 5*a*, 5*b* and 5*c* are cross-sectional views of a third embodiment of a printing plate made in accordance with the present invention.
Figure 5B:
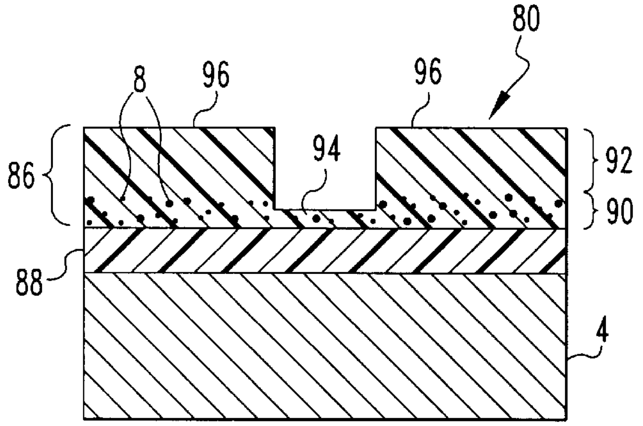
Figure 5C:
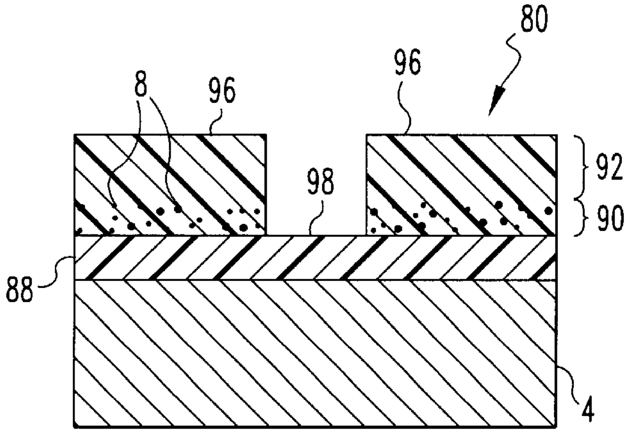

A third embodiment of the invention is shown in FIGS. 5a, 5b and 5c and includes a plate 80 having a substrate 4 and a laser-ablatable member 86 formed from an acrylic polymer and an intermediate layer 88. Laser-sensitive particles 8 are dispersed in the laser-ablatable member 86 in a layer 90 positioned near or adjacent the bottom of the laser-ablatable member 86 which is covered by an upper portion 92 of the member 86 not having any laser-sensitive particles therein. The intermediate layer 88 may be formed from a thermoplastic or elastomeric polymer as described above. It has been found that certain laser-ablatable members having laser-sensitive particles present at the interface between the laser-ablatable member and the substrate demonstrate improved adhesion to the substrate when an intermediate layer is positioned therebetween. The intermediate layer 88 serves to enhance the adhesion of the laser-ablatable member 86 to the substrate 4.

As shown in FIG. 5b, the plate 80 is preferably imaged with a laser to completely remove the portion 92 and partially ablate the layer 90 to exposes regions 94 and leave unablated regions 96. The regions 94 are oleophilic and the regions 96 are hydrophilic. Alternatively, the laser-ablatable member 86 may be completely removed as shown in FIG. 5c by fully ablating the layer 90 to expose regions 98 of the oleophilic intermediate layer 88 and leave the unablated regions 96. In either case, ink of a printing liquid will adhere to the exposed regions 94 (FIG. 5b) or 98 (FIG. 5c) and water or a fountain solution will adhere to the unablated regions 96.

Figure 6A:
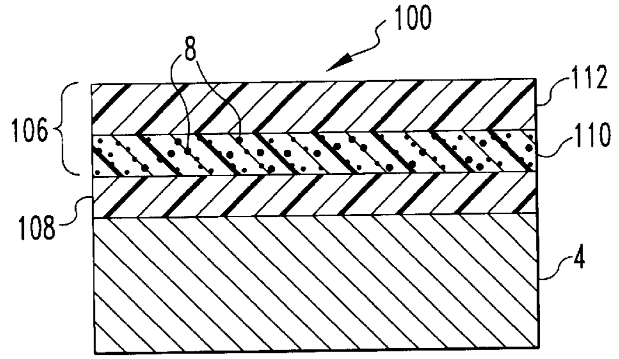
FIGS. 6*a*, 6*b* and 6*c* are cross-sectional views of a fourth embodiment of the printing plate.
Figure 6B:
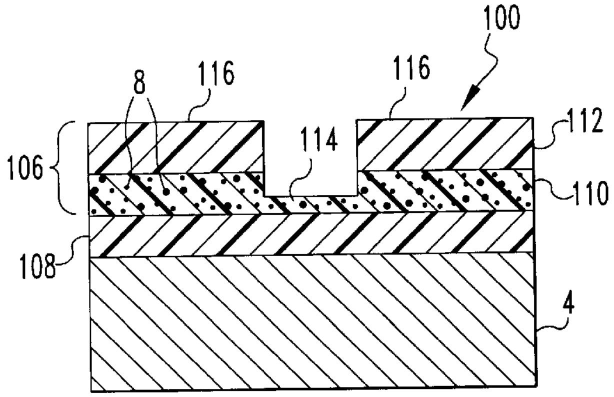
Figure 6C:
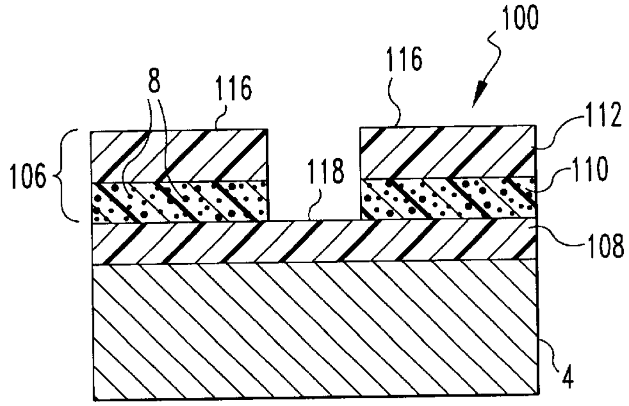

FIGS. 6a, 6b and 6c show a fourth embodiment of the invention including a printing plate 100 having a substrate 4, a laser-ablatable member 106 and an optional intermediate layer 108. The intermediate layer 108 is similar to the layer 88 of plate 80 and may be formed from a thermoplastic or elastomeric polymer as described above. The laser-ablatable member 106 includes a first layer 110 formed from an acrylic polymer having laser-sensitive particles 8 dispersed therein and a second layer 112 formed from a polymer having a different affinity for a printing liquid from one or more of the layers 108 and 110. Suitable polymers for the second layer 112 are silicone polymers or copolymers (referred to collectively hereinafter as silicone polymers) and which are typically hydrophobic and oleophobic. Suitable silicone polymers include fluorosilicone, dimethyl silicone, diphenyl silicone, and nitryl silicone.

As shown in FIG. 6b, the plate 100 is preferably imaged with a laser to completely remove the second layer 112 and partially ablate the layer 110 to exposes regions 114 and leave unablated regions 116. The regions 116 are hydrophobic and oleophobic and the regions 114 are oleophilic. Alternatively, the laser-ablatable member 106 may be completely removed as shown in FIG. 6c by fully ablating the layer 110 to expose regions 118 of the oleophilic intermediate layer 108 and leave the unablated regions 116. Plate 100 may be used with waterless printing liquid. Ink adheres to the exposed oleophilic regions 114 (FIG. 6b) or 118 (FIG. 6c) and is repelled by the unablated regions 116.

Figure 7A:
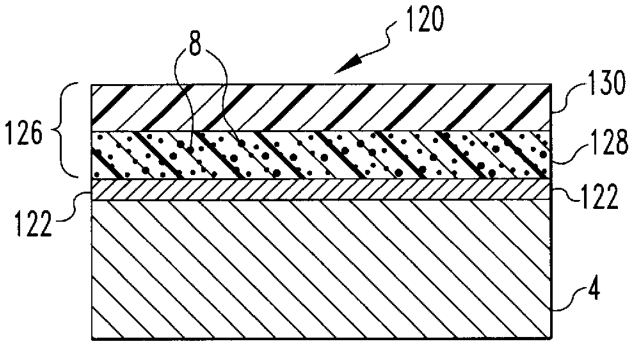
FIGS. 7*a*, 7*b*, 7*c* and 7*d* are cross-sectional views of a fifth embodiment of a printing plate made in accordance with the present invention.
Figure 7B:
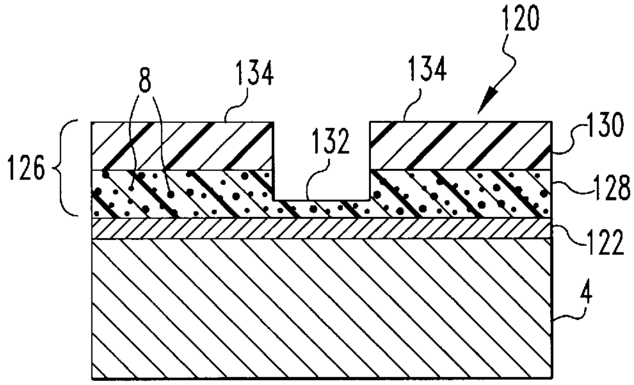

A fifth embodiment of the invention shown in FIGS. 7a and 7b includes a printing plate 120 having a substrate 4 with an optional pretreatment portion 122 and a laser-ablatable member 126. The pretreatment portion 122 of the substrate 4 may be a separate layer of a polymer or may be an integral conversion coating. Suitable polymers are acrylic polymers, a hydrophilic polypropylene composition and thermoplastic or elastomeric polymers which may be applied to the substrate 4 via roll coating, spray coating, immersion coating, emulsion coating, powder coating or vacuum coating. While polypropylene is inherently oleophilic, a composition containing and a sufficient amount of filler particles is hydrophilic. Suitable filler particles include the laser-sensitive particles described above. Another suitable polymer for the pretreatment portion 122 is an electrocoated polymer such as an epoxy resin as described in U.S. Ser. No. 09/519,018 filed Mar. 3, 2000 entitled "Electrocoating Process for making Lithographic Sheet Material", assigned to the assignee of this application and incorporated herein by reference. When the substrate 4 is aluminum or another metal, the pretreatment portion 122 may be a conversion coating (a reacted surface of the substrate 4) instead of an additional layer applied to the substrate 4. Preferred conversion coatings for the pretreatment portion 122 include salts of or compounds of Zn, Cr, P, Zr, Ti and Mo.

The laser-ablatable member 126 includes a first layer 128 formed from an acrylic polymer having laser-sensitive particles 8 dispersed therein and a second layer 130 formed from a polymer having a different affinity for a printing liquid from the layer 128. Suitable materials for the second layer 130 are hydrophilic polymers such as acrylic polymers and hydrophilic polypropylene compositions. The polymer of the second layer 130 may also be a hydrophobic and oleophobic polymer such as a silicone polymer or copolymer. Suitable silicone compositions include fluorosilicone, dimethyl silicone, diphenyl silicone, and nitryl silicone.

As shown in FIG. 7b, the plate 120 is preferably imaged with a laser to completely remove the second layer 130 and partially ablate the layer 128 to expose oleophilic regions 132 and leave unablated regions 134. When the second layer 130 is formed from an acrylic polymer, the regions 134 are hydrophilic. Ink of a printing liquid will adhere to the exposed regions 132 and water or a fountain solution will adhere to the unablated regions 134. When the second layer 130 is formed from a silicone polymer, the regions 134 are hydrophobic and oleophobic, and the plate 120 may be used with waterless printing liquid. Ink is repelled by the silicone containing second layer 130 and ink adheres to the oleophilic regions 132.

Figure 7C:
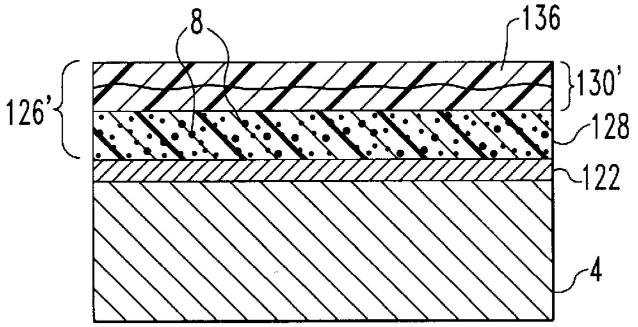
Figure 7D:
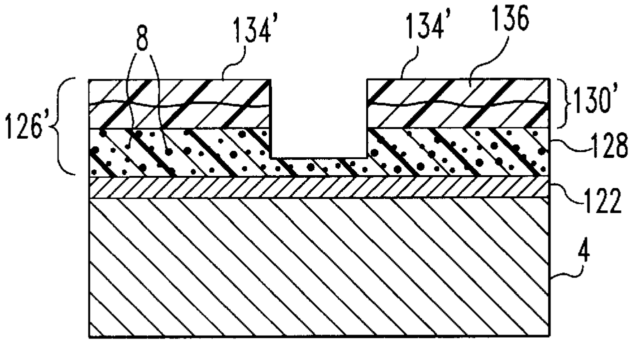

Alternatively, as shown in FIGS. 7c and 7d, a plate 120' includes a substrate 4 and a laser-ablatable member 126' similar to the laser-ablatable member 126 of the plate 120 except that the second layer 130' is formed from an oleophilic polymer such as the thermoplastic or elastomeric polymers described above. An upper portion 136 of the second layer 130' is treated to make the upper portion 136 hydrophilic as described above in reference to the plate 2'. Referring to FIG. 7*d*, the plate 120' is preferably imaged with a laser to completely remove the second layer 130' to expose the oleophilic polymer of layer 128 while leaving unablated regions 134'. The second layer 130' may further include a plurality of laser-sensitive particles. It is also possible to ablate the hydrophilic upper portion 136 to expose the oleophilic polymer of the second layer 130'.

A key aspect of the present invention is the use of a laser-ablatable member that at least in part includes a polymer composition having an acrylic polymer or other hydrophilic polymer and a plurality of laser-sensitive particles. It has been found that printing plates incorporating this polymer composition may be successfully imaged via laser ablation and are sufficiently durable to be used in numerous printing cycles. Although the present invention has been described as including laser-sensitive particles in the ablatable polymer layers, this is not meant to be limiting. Laser radiation may be controlled to ablated the desired polymer layers without including the laser-sensitive particles therein.

Figure 8A:
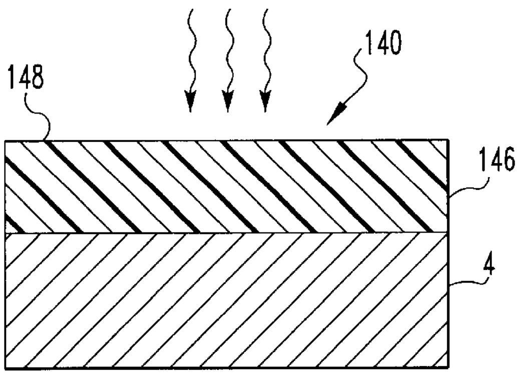
FIGS. 8*a* and 8*b* are cross-sectional views of a sixth embodiment of a printing plate made in accordance with the present invention.
Figure 8B:
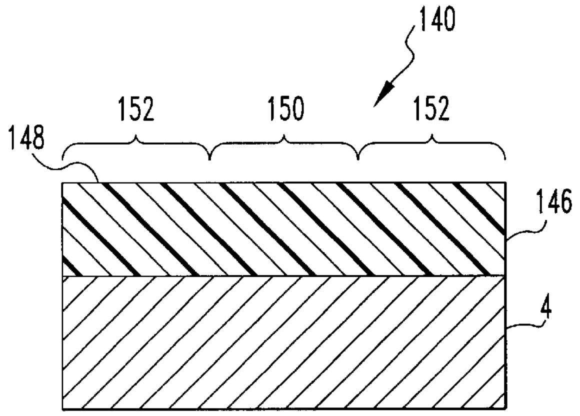

The invention also includes a printing plate having a printing member which is not ablated by imaging radiation and a method of imaging the same. FIGS. 8*a* and 8*b* show a printing plate 140 having a substrate 4 and a polymeric printing member 146. The polymer of the printing member 146 has an initial affinity for a printing liquid and is preferably formed from an acrylic polymer such that an upper surface 148 of the printing member 146 is hydrophilic. In this embodiment, no laser-sensitive particles are included in the printing member 146. Upon exposure to imaging radiation from a laser or the like as shown in FIG. 8*a*, portions 150 of the upper surface become oleophilic while unexposed portions 152 remain hydrophilic (FIG. 8*b*) thereby creating a printable image. It is believed that the energy of the radiation causes the surface chemistry of the upper surface 148 to change such that the affinity of a printing liquid by the upper surface 146 changes.

Figure 9A:
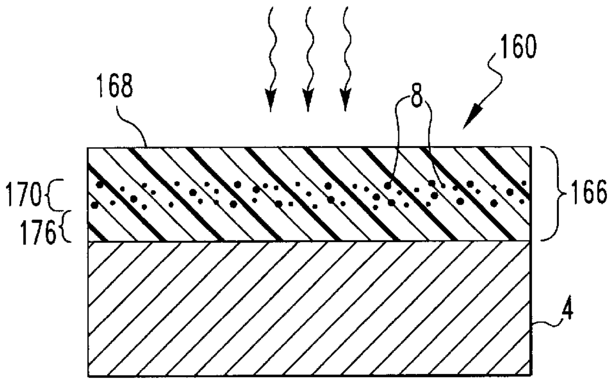
FIGS. 9*a* and 9*b* are cross-sectional views of a variation of the printing plate shown in FIGS. 8*a* and 8*b*.
Figure 9B:
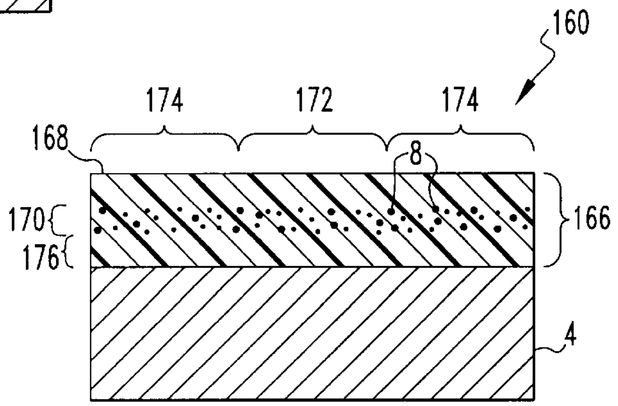

A printing plate 160 which includes laser-sensitive particles 8 is shown in FIGS. 9*a* and 9*b*. The printing plate 160 has a substrate 4 and a polymeric printing member 166. The polymer of the printing member 166 has an initial affinity for a printing liquid and is preferably formed from an acrylic polymer such that an upper surface 168 of the printing member 166 is hydrophilic. The printing member 166 includes a first layer 170 formed from an acrylic polymer and having laser-sensitive particles 8 dispersed therein similar to plate 40 shown in FIG. 3*a*. Upon exposure to imaging radiation from a laser or the like as shown in FIG. 9*a*, portions 172 of the upper surface 168 become oleophilic while unexposed portions 174 remain hydrophilic (FIG. 9*b*) thereby creating a printable image. It is believed that the radiation is absorbed by the particles 8 causing the particles 8 to vibrate and generate heat which is conducted to the upper surface 168. Heating of the upper surface 168 is believed to change the surface chemistry of the upper surface 168 such that the affinity to a printing liquid by the upper surface 168 changes. The printing member 166 may further include a second layer 176 formed from the same materials as the layer 52 of the plate 40 (FIG. 3*a*) or the layer 122 of the plate 120 (FIG. 7*a*). Alternatively, the layer 170 containing the laser-sensitive particles 8 may be positioned adjacent the substrate 4 (not shown) or may be the uppermost layer of the printing member 166 (not shown) so that the upper surface 168 includes the laser-sensitive particles 8. The laser-sensitive particles 8 may also be distributed throughout the printing member 166 similar to the laser-ablatable member 6 of plate 2 (FIG. 1*a*).

Other polymer compositions may be used in the printing members 146 and 166 (e.g. a polymer which is initially oleophilic and changes to be hydrophilic upon exposure to imaging radiation) provided that the initial and final affinities of the upper surface 148 or 168 for a printing liquid are distinct to allow for lithographic printing. The plates 140 and 160 may be manufactured as described above for the plates 2, 20, 40 and 60.

It will be readily appreciated by those skilled in the art that modifications may be made to the invention without departing from the concepts disclosed in the foregoing description. Such modifications are to be considered as included within the following claims unless the claims, by their language, expressly state otherwise. Accordingly, the particular embodiments described in detail herein are illustrative only and are not limiting to the scope of the invention which is to be given the full breadth of the appended claims and any and all equivalents thereof.

What is claimed is:

1. A printing plate imageable by laser radiation comprising:

a substrate having a principal surface; and a printing member positioned on said principal surface and having an upper surface comprising a polyineric composition, said upper surface being non-ablatable by imaging radiation and wherein said upper surface has an initial affinity for a printing liquid and is changeable to a different affinity for a printing liquid when said printing member is subjected to imaging radiation, where said polymeric composition comprises a laser-imageable copolymer of 50–95 mol % acrylic acid and 5–50 mol % vinyl phosphonic acid, wherein said printing member includes a first layer underlying said upper surface, said first layer comprising a polymer and a plurality of radiation-absorbing particles.

2. The printing plate of claim 1 wherein said radiation-absorbing particles are selected from the group consisting of a dye, a metal, a mineral and carbon.

3. The printing plate of claim 1 wherein said first layer comprises an acrylic polymer.

4. The printing plate of claim 1 further comprising a second layer underlying said first layer.

5. The printing plate of claim 4 wherein said second layer comprises an acrylic polymer.

6. The printing plate of claim 4 wherein said second layer comprises a conversion coating comprising a salt or compound of Zn, Cr, P, Zr, Ti or Mo.

* * * * *